(12) United States Patent
Asuri et al.

(10) Patent No.: US 8,774,742 B2
(45) Date of Patent: Jul. 8, 2014

(54) HIGH EFFICIENCY TRANSMITTER

(75) Inventors: Bhushan Shanti Asuri, San Diego, CA (US); Ibrahim Ramez Chamas, San Diego, CA (US); Prasad Srinivasa Siva Gudem, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 91 days.

(21) Appl. No.: 13/353,062

(22) Filed: Jan. 18, 2012

(65) Prior Publication Data

US 2013/0183917 A1   Jul. 18, 2013

(51) Int. Cl.
*H04B 1/04* (2006.01)

(52) U.S. Cl.
USPC ............. 455/127.5; 455/115.3; 375/296

(58) Field of Classification Search
USPC .......... 455/114.2, 115.1–115.3, 127.1, 127.5; 375/296, 297
See application file for complete search history.

(56) References Cited

U.S. PATENT DOCUMENTS

| | | | |
|---|---|---|---|
| 6,201,952 B1 | 3/2001 | Shimizu et al. | |
| 6,288,606 B1 | 9/2001 | Ekman et al. | |
| 6,373,902 B1 * | 4/2002 | Park et al. | 375/296 |
| 7,113,748 B2 | 9/2006 | Shapira et al. | |
| 7,444,124 B1 | 10/2008 | Loeb et al. | |
| 7,538,735 B2 | 5/2009 | Crouch | |
| 7,570,932 B1 | 8/2009 | Folkmann | |
| 7,746,967 B2 | 6/2010 | Ho et al. | |
| 8,335,535 B2 * | 12/2012 | Iseda | 455/522 |
| 8,391,932 B2 * | 3/2013 | Thomas et al. | 455/574 |
| 2005/0151586 A1 * | 7/2005 | Grillo et al. | 330/136 |

FOREIGN PATENT DOCUMENTS

| | | |
|---|---|---|
| EP | 1931053 A2 | 6/2008 |
| WO | 2007056137 A2 | 5/2007 |

OTHER PUBLICATIONS

International Search Report and Written Opinion—PCT/US2013/022208—ISA/EPO—Apr. 23, 2013.

* cited by examiner

*Primary Examiner* — Nhan Le
(74) *Attorney, Agent, or Firm* — Ramin Mobarhan

(57) ABSTRACT

A high efficiency transmitter is disclosed. In an exemplary embodiment, a transmitter is provided that includes a first transmission path configured to receive a baseband signal and generate a first RF output when output power is in a first output power range, and a second transmission path configured to receive the baseband signal and generate a second RF output when the output power is in a second output power range.

20 Claims, 8 Drawing Sheets

HIGH EFFICIENCY TRANSMITTER

BACKGROUND

1. Field

The present application relates generally to the operation and design of wireless devices, and more particularly, to the operation and design of wireless transmitters.

2. Background

There is an increasing demand to have wireless devices capable of low power operation to provide extended talk times. One key to achieving lower power consumption is associated with the performance of the device's transmitter. For example, it is desirable to have a transmitter for use in a wireless device that utilizes power very efficiently thereby extending talk times.

Typically, transmitters used by devices operating on wireless networks have a very wide dynamic range requirement (i.e., >75 dB). For example, in a multiple access wireless communication network, if all devices transmit at a high power level (i.e., limited dynamic range), for instance to provide greater coverage area per base station and thereby reduce costs, the signals transmitted from devices closer to the base station will be received with much higher signal strengths and will overpower signals transmitted from devices further away from the base station. Therefore, a wide dynamic range is required so that devices in communication with a distant base station can transmit at higher transmit powers than devices closer to the same base station. By controlling the transmit power of the devices based on their proximity to the base station, it is possible for the base station to receive the transmitted signals with approximately equal power levels, thereby providing the highest throughput for all devices.

When transmitting at very high output power (i.e., 4 dBm) the transmitter has to satisfy stringent linearity requirements. When transmitting at low output power (i.e., −55 dBm) the transmitter is constrained by the need for good local oscillator (LO) leakage and image suppression. When transmitting at medium output power (i.e., −8 dBm) the transmitter should consume as little battery current as possible to extend talk times. For example, in typical network implementations, the numbers and locations of the base stations are determined so that the medium power range happens to be the "most probable" power range used for voice calls.

Unfortunately, existing transmitters used in wireless devices are not very efficient at the medium and low output power ranges. It is therefore desirable to have a more efficient transmitter for use in wireless devices.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
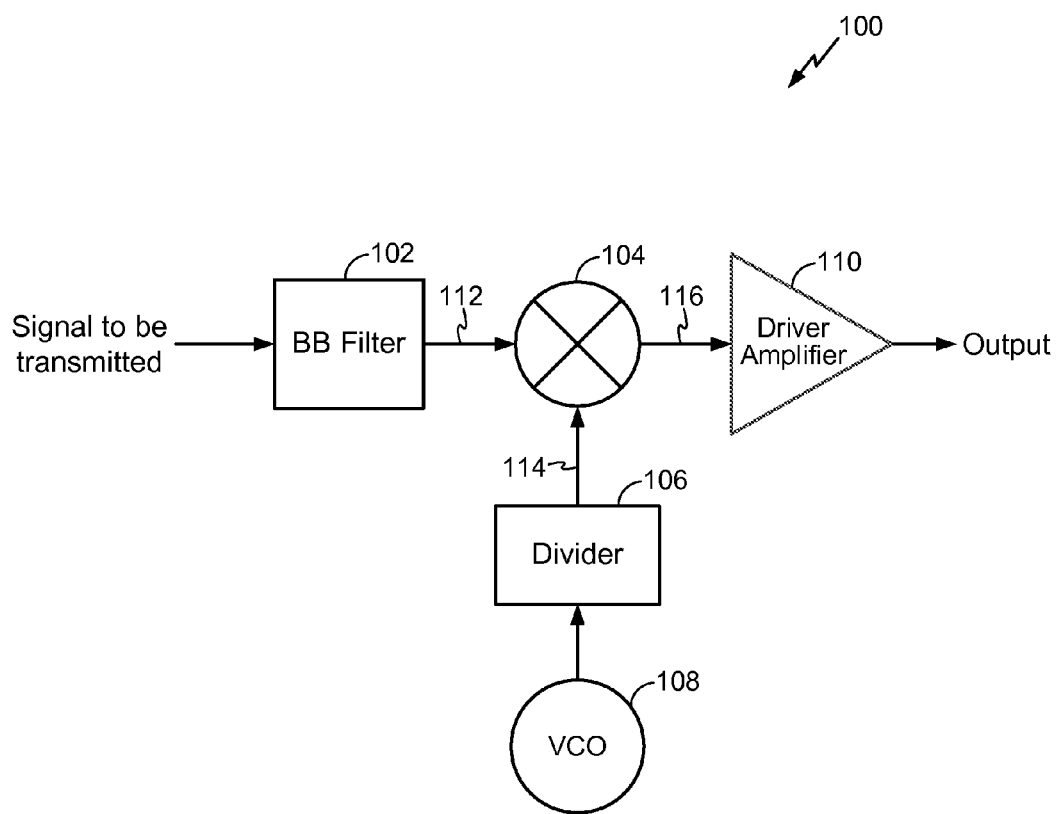
FIG. 1 shows a conventional transmitter for use in a wireless device.

FIG. 1 shows a conventional transmitter 100 for use in a wireless device. The transmitter 100 comprises a baseband filter 102 that receives a signal to be transmitted and filters this signal to generate a filtered signal 112 that is input to an upconverter 104. The upconverter 104 upconverters the frequency based on an LO signal 114 received from a frequency divider 108. The frequency divider generates the LO signal 114 from an output of a voltage controlled oscillator 108. The upconverted signal 116 is input to a driver amplifier 106 for amplification before transmission.

During operation, the transmitter 100 operates in a wireless device to meet the wide dynamic range requirements of a multiple access communication network. For example, the transmitter 100 is required to transmit at high power levels when the device is far away from a receiving base station and to transit at lower power levels when the device is closer to the receiving base station. Unfortunately, the components of the transmitter 100 may operate most efficiently at high output power. This means that at lower output powers, which are typically used during voice calls, the transmitter 100 operates less efficiently thereby wasting battery power and reducing talk times.

Figure 2:
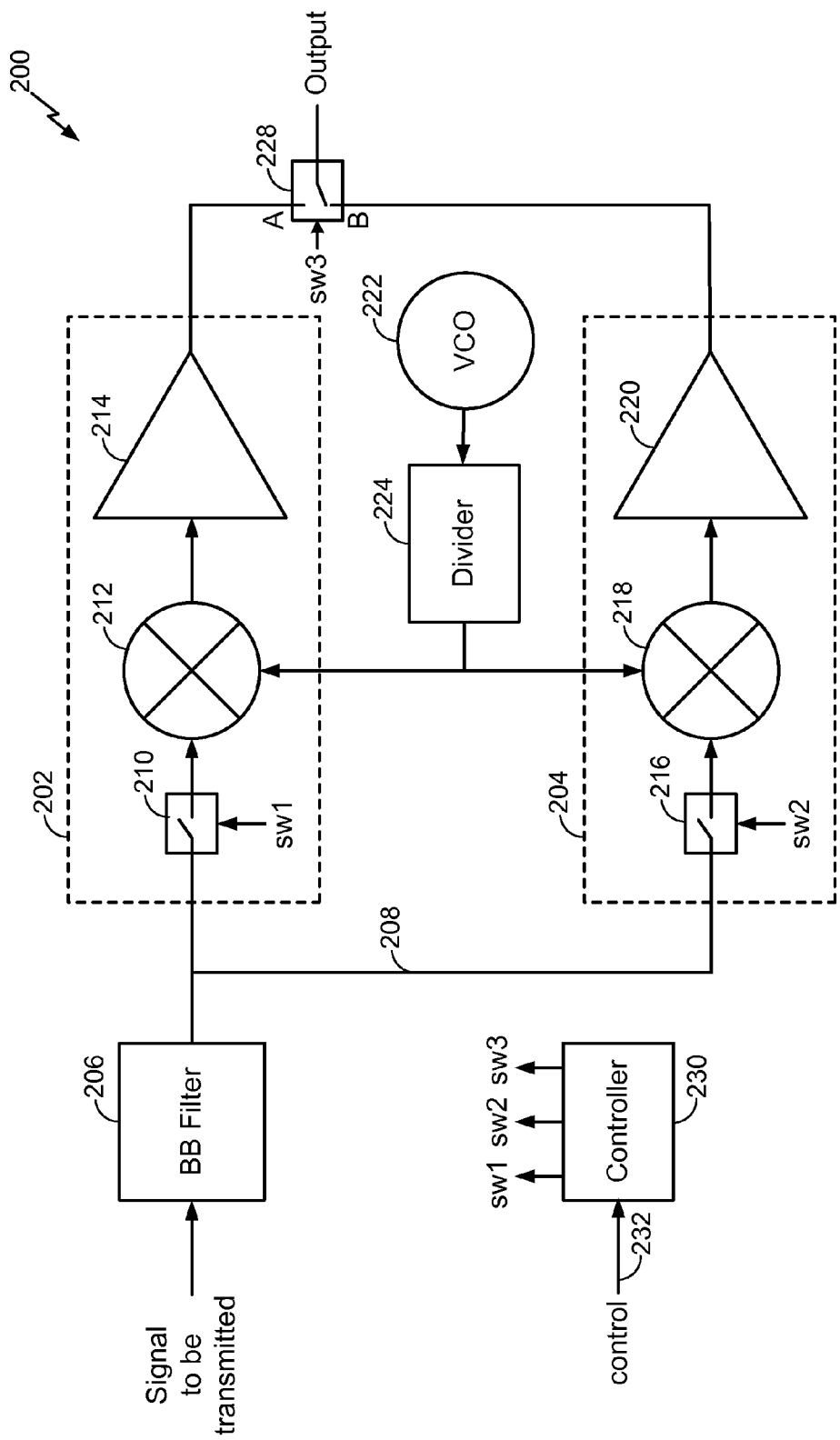
FIG. 2 shows an exemplary embodiment of a high efficiency transmitter for use in a wireless device.

FIG. 2 shows an exemplary embodiment of a high efficiency transmitter 200 for use in a wireless device. The transmitter 200 comprises a main transmission path 202 and a high efficiency transmission path 204. The transmitter 200 comprises a baseband (BB) filter 206 that receives a signal to be transmitted and generates a filtered signal 208 that is input to both the main transmission path 202 and the high efficiency transmission path 204. The main transmission path 202 comprises a switch 210, upconverter 212 and driver amplifier 214. The high efficiency transmission path 204 comprises a switch 218, upconverter 218 and driver amplifier 220. The driver amplifiers 214 and 220 have outputs that are connected to a switch 228.

A controller 230 is provided that generates switch control signals sw1, sw2, and sw3. The switch control signals are connected to the switches 210, 216 and 228 and control the operation of these switches. The controller comprises a processor, CPU, gate array, firmware, hardware logic or any other hardware and/or hardware executing software that is configured to receive a control signal 232 from another entity in the wireless device and use this control signal to set the switches sw1, sw2 and sw3 to control the operation of the transmitter 200.

The upconverter 212 and the driver amplifier 214 of the main transmission path 202 are configured to operate at high efficiency when transmitting at high output power levels (i.e., a first output power range). However, at medium and low output power levels (i.e., a second output power range), the upconverter 212 and the driver amplifier 214 operate at lower efficiency levels.

The upconverter 218 and the driver amplifier 220 of the high efficiency transmission path 204 are configured to operate at high efficiency when transmitting at medium to low output power levels (i.e., the second output power range). For example, the upconverter 218 and DA 220 of the high efficiency transmission path comprise design elements specific to improving efficiency while utilizing the fact that at low power levels several performance requirements are relaxed. For example, RX band noise at the output of the transmitter is relaxed, which means that the upconverter 218 can be operated with less current. The upconverter 218 can also utilize a resistive load to provide more voltage swing.

Therefore, in an exemplary embodiment, the upconverter 218 is more efficient than the upconverter 212 at medium to low power levels, and the driver amplifier 220 is more efficient than the driver amplifier 214 at medium to low power levels. Thus, the high efficiency transmission path 204 operates at higher efficiency at medium to low output power levels than the main transmission path 202.

During operation, a signal to be transmitted is filtered by the baseband filter 208 and input to the switches 210 and 216. The controller 230 receives a control signal 232 that indicates the desired output power level of the signal to be transmitted. The controller 230 operates to control the switches 210, 216, and 228 by generating the switch control signals sw1, sw2, and sw3 based on the power level indicated by the control signal 232. For example, if the power level indicated is above a selected power threshold (e.g., −8 dBm) then the controller 230 sets the switch control signals sw1, sw2, and sw3 so that switch 210 is closed, switch 216 is open, and switch 228 is set to couple terminal A to the output. This enables the main transmission path 202 to efficiently transmit the signal to be transmitted at a high output power level. For example, the main transmission path 202 is enabled when the desired output power is within a first power range that is above a selected power threshold level of −8 dBm.

If the power level indicated by the control signal 232 is at or below the selected power threshold (i.e., −8 dBm) then the controller 230 sets the switch control signals sw1, sw2, and sw3 so that switch 210 is open, switch 216 is closed, and switch 228 is set to couple terminal B to the output. This enables the high efficiency transmission path 204 to efficiently transmit the signal to be transmitted at a lower output power level. For example, the high efficiency transmission path 204 is enabled when the desired output power is within a second power range that is at or below the selected power threshold level of −8 dBm. In various exemplary embodiments, any desired threshold levels and/or power ranges may be utilized to determine the transmission path to be used.

Therefore, in an exemplary embodiment, the novel transmitter 200 comprises two transmission paths (202, 204). The main path (202) is used at high output power levels and the high efficiency path (204) is used at lower output power levels to provide greater efficiency at the lower power levels than the main path 202. Each path comprises its own upconverter and driver amplifier. The outputs of the driver amplifiers of the two paths are connected at an output switch 228 which directs the appropriate signal to an antenna for transmission based on the switch control signal sw3.

Figure 3:
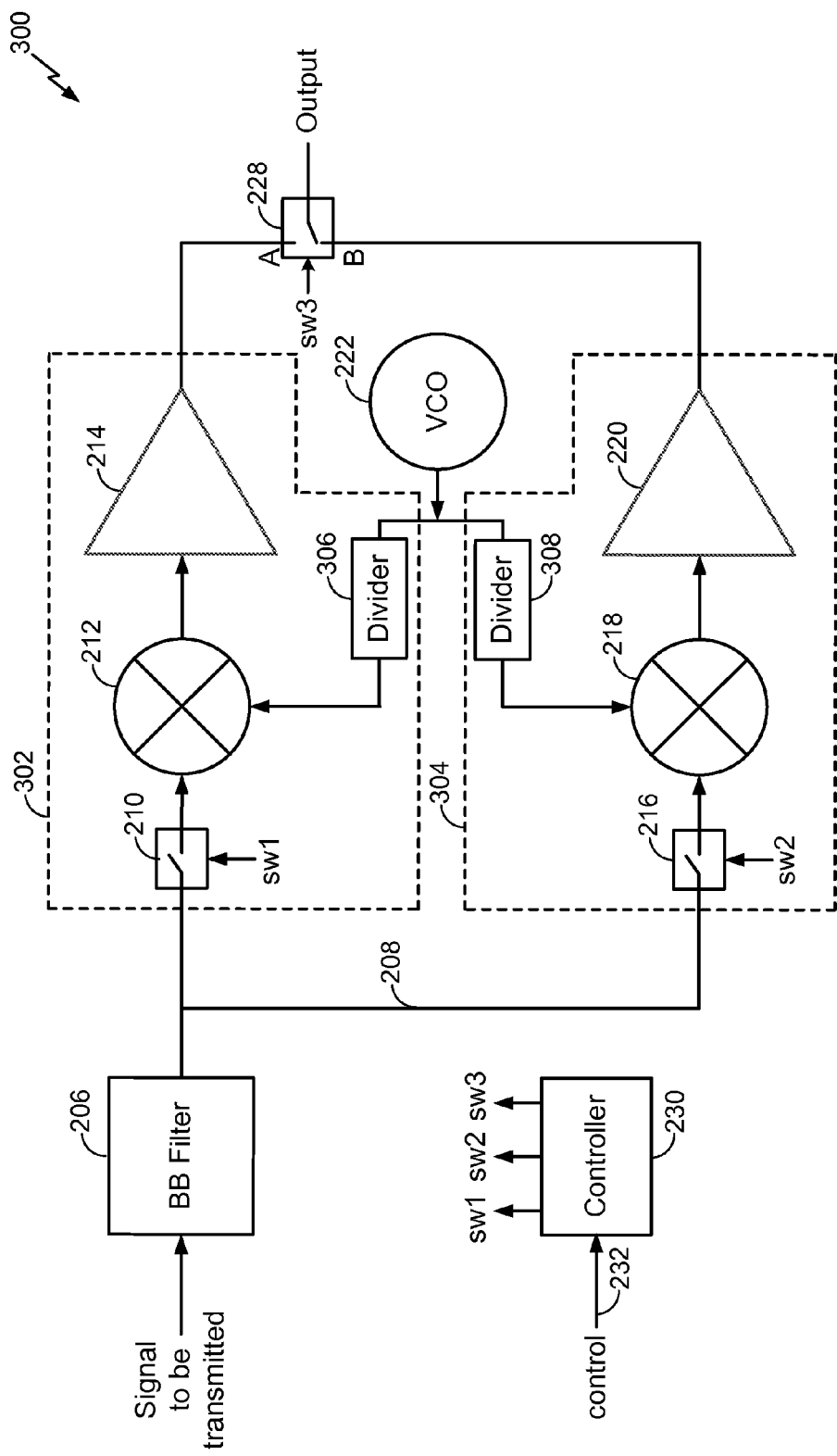
FIG. 3 shows an exemplary embodiment of a high efficiency transmitter for use in a wireless device.

FIG. 3 shows an exemplary embodiment of a high efficiency transmitter 300 for use in a wireless device. The transmitter 300 comprises a main transmission path 302 and a high efficiency transmission path 304. The transmitter 300 comprises components similar to the transmitter 200 except that the frequency divider 224 of the transmitter 200 has be separated into two frequency dividers (306, 308) that are included in the main 302 and high 304 efficiency transmission paths, respectively. The VCO 222 is configured to output an oscillator signal that is coupled to both the divider 306 and the divider 308.

The frequency divider 306 is configured to operate at high efficiency when transmitting at high output power levels. However, at medium and low output power levels, the frequency divider 306 operates at lower efficiency levels. The frequency divider 308 is configured to operate at high efficiency when transmitting at medium to low output power levels. For example, in an exemplary embodiment, the frequency divider 308 is configured to operation more efficiently than the frequency divider 306 at medium to low power levels. Thus, the high efficiency transmission path 304 operates at higher efficiency at medium to low output power levels than the main transmission path 302.

Therefore, in an exemplary embodiment, the novel transmitter 300 comprises two transmission paths (302, 304). The main path 302 is used at high power and includes the frequency divider 306. The high efficiency path (304) is used at low power and includes the frequency divider 308 to provide greater efficiency at the lower power level than the main path 302. Each path comprises its own upconverter, frequency divider, and driver amplifier. The outputs of the driver amplifiers of the two paths are connected at an output switch 228 which directs the appropriate signal to an antenna for transmission based on the switch control signal sw3.

Figure 4:
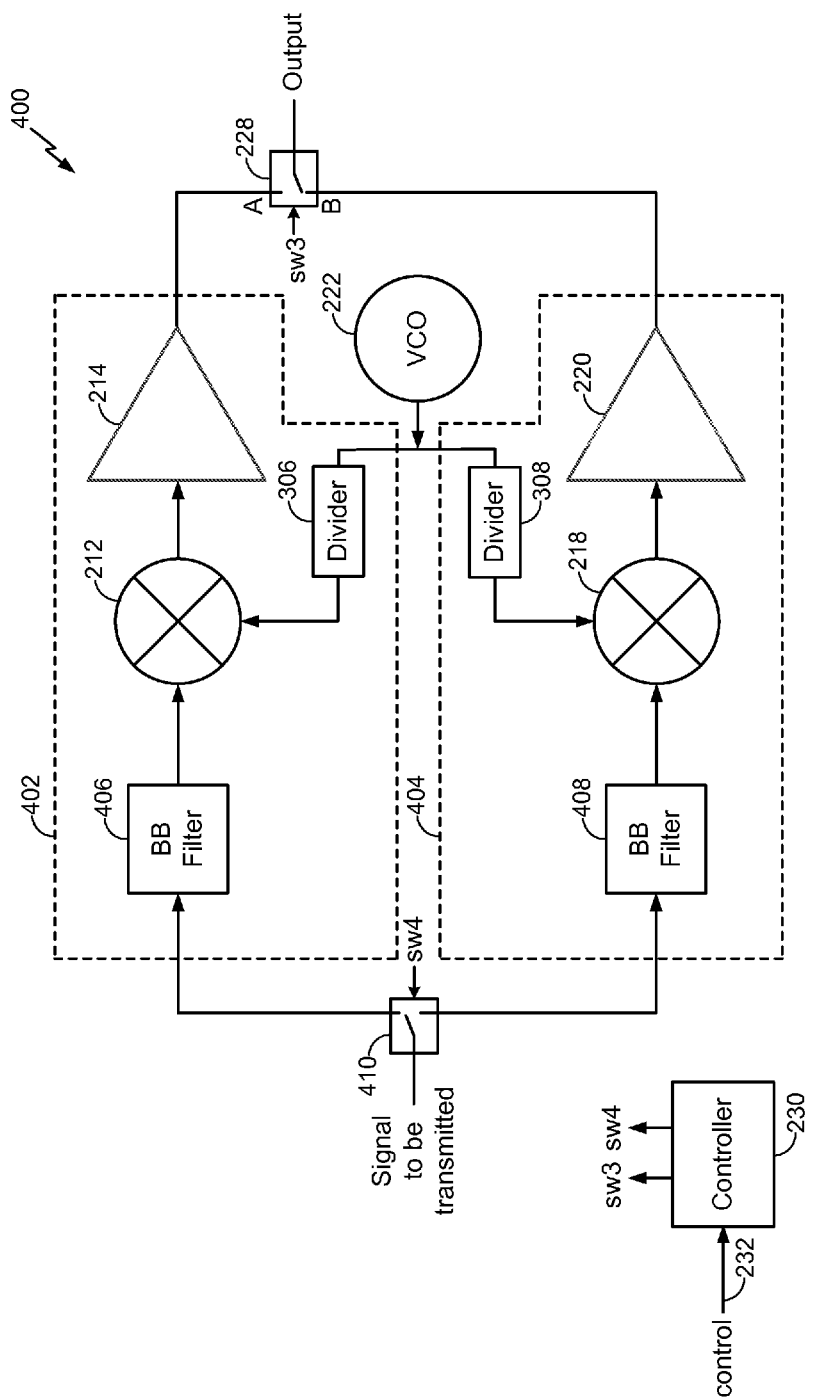
FIG. 4 shows an exemplary embodiment of a high efficiency transmitter for use in a wireless device.

FIG. 4 shows an exemplary embodiment of a high efficiency transmitter 400 for use in a wireless device. The transmitter 400 comprises a main transmission path 402 and a high efficiency transmission path 404. The transmitter 400 comprises components similar to the transmitter 300 except that the baseband filter 206 of the transmitter 300 has be separated into two baseband filters (406, 408) that are included in the main 402 and high efficiency 404 transmission paths, respectively. Additionally, switch 410 has been added and the controller 230 is configured to generate a switch control signal sw4 to control switch 410.

The baseband filter 406 is configured to operate at high efficiency when transmitting at high output power levels. However, at medium and low output power levels, the baseband filter 406 operates at lower efficiency levels. The baseband filter 408 is configured to operate at high efficiency when transmitting at medium to low output power levels. For example, in an exemplary embodiment, the baseband filter 408 is configured to operate more efficiently than the baseband filter 406 at medium to low power levels. Thus, the high efficiency transmission path 404 operates at higher efficiency at medium to low output power levels than the main transmission path 402.

Therefore, in an exemplary embodiment, the novel transmitter 400 comprises two transmission paths (402, 404). The main path 402 is used at high power and includes the baseband filter 406. The high efficiency path (404) is used at medium to low power and includes the baseband filter 408 to provide greater efficiency at the lower power level than the main path 402. Each path comprises its own baseband filter, upconverter, frequency divider, and driver amplifier. The outputs of the driver amplifiers of the two paths are connected at an output switch 228 which directs the appropriate signal to an antenna for transmission based on the switch control signal sw3.

Active Impedance Matching Circuit

In the high power transmission path 402, fixed loading from the DA 214 prevents a resistive load from being used because it tunes the load lower in frequency. In the high efficiency transmission path 404, the DA 220 is operated with a very small capacitive load allowing for resistively loaded operation of the upconverter 218. The output swing may be limited since the maximum power that needs to be delivered is smaller. Accordingly, a special active impedance matching circuit, referred to as a source follower matching circuit is provided at the output of the DA 220. The source follower active matching circuit does not consume a large portion of the delivered power, thus providing additional power savings. Exemplary embodiments of the active matching circuit are described in more detail below.

The talk-time current of WAN transmitters is typically measured at an output power level of −8 dBm (i.e., assume 50 ohm system), which corresponds to approximately 0 dBm antenna power. In conventional systems, the −8 dBm output power can be generated by an impedance matched driver amplifier (IMDA).

Figure 5:
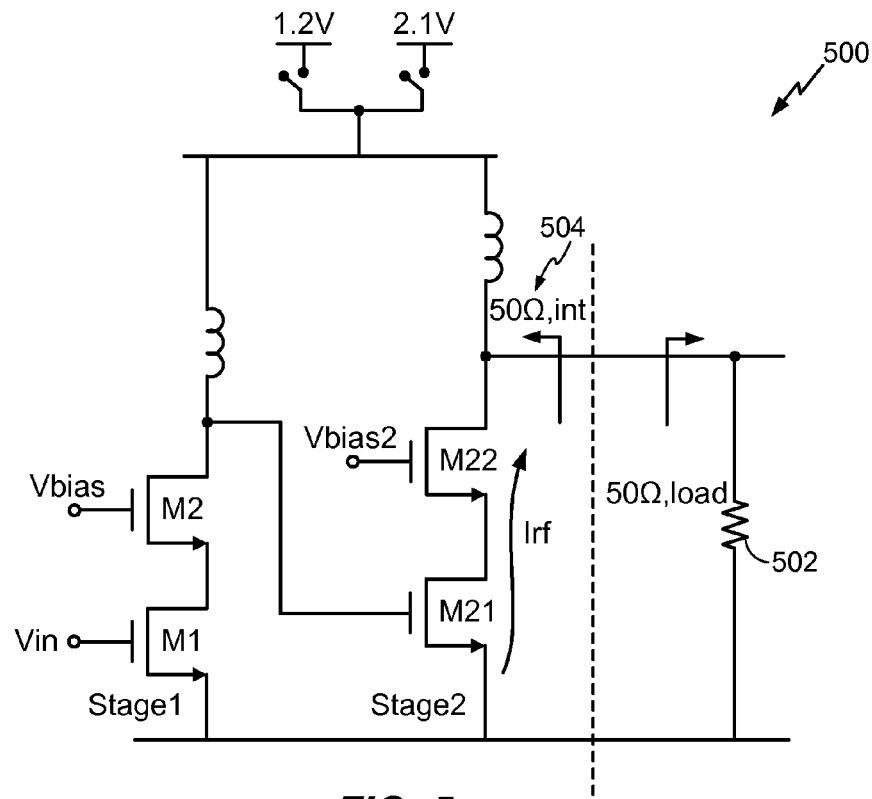
FIG. 5 shows a conventional two stage inductively loaded common-source cascode driver amplifier.

FIG. 5 shows a conventional two stage inductively loaded common-source cascode driver amplifier 500. The first stage provides voltage gain while the output stage delivers the power to a 50Ω load 502. By virtue of the impedance match, half of the RF current generated by the DA output stage is absorbed by the internal 50Ω impedance 504. Thus, by design, the classical DA implementation with matched output impedance is 50% efficient since only half the generated RF current flows to the load to generate the required power. And, based on the exact details of the circuit biasing the efficiency is typically much lower. For example, at an output power of −8 dBm, it will be assume that the signal current needed is 2.64 mA. Since half this current is wasted in the internal matching of the DA 500, the core devices of the DA 500 need to generate a signal current of (2*2.64 mA)=5.28 mA. For good linearity and accounting for typical signal current loss, the supply current of the passively matched DA 500 will be approximately 6 mA from the 1.3V supply. Therefore, it would be desirable to eliminate the signal current loss through the internal impedance matching of the DA 500.

Figure 6:
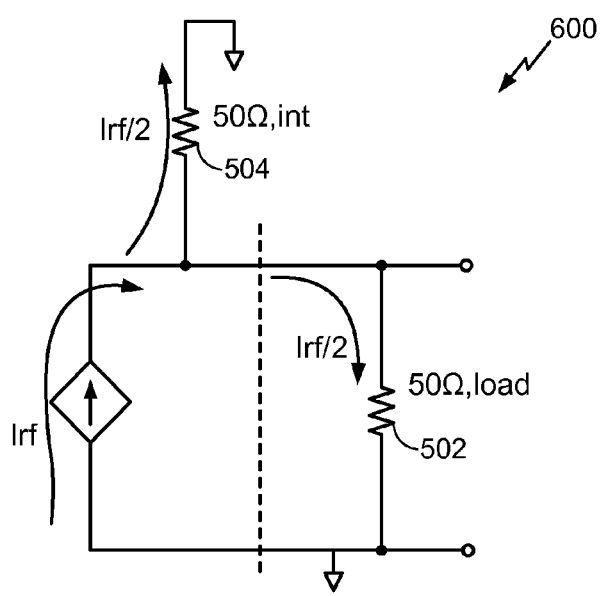
FIG. 6 shows a diagram that illustrates current flow in the conventional driver amplifier shown in FIG. 5.

FIG. 6 shows a diagram 600 that illustrates current flow in the conventional driver amplifier shown in FIG. 5. For example, the diagram 600 illustrates how only one half of the current generated by the IMDA 500 flows to the output load. For example, the core devices of the IMDA 500 generate an RF current (Irf) and one half of this current (Irf/2) flows to the output load 502 and the other half of this current (Irf/2) flows through the internal matching circuit 504.

Figure 7:
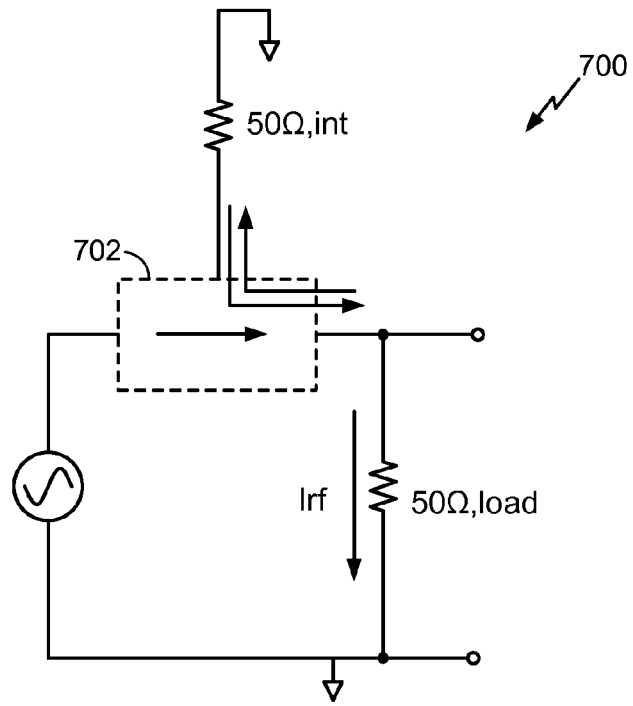
FIG. 7 shows an exemplary embodiment of a highly efficient driver amplifier for use in a wireless device.

FIG. 7 shows an exemplary embodiment of a highly efficient driver amplifier 700 for use in a wireless device. For example, the DA 700 is suitable for use as the DA 220 shown in FIG. 4. The DA 700 is configured to control the directionality of the output port to make sure that all the RF current is routed to the 50Ω load while the output port still "sees" a 50Ω internal impedance match. In an exemplary embodiment, the DA 700 utilizes an isolator 702 to control the directionality of the output port and therefore all the generated current flows to the 50Ω load.

Figure 8:
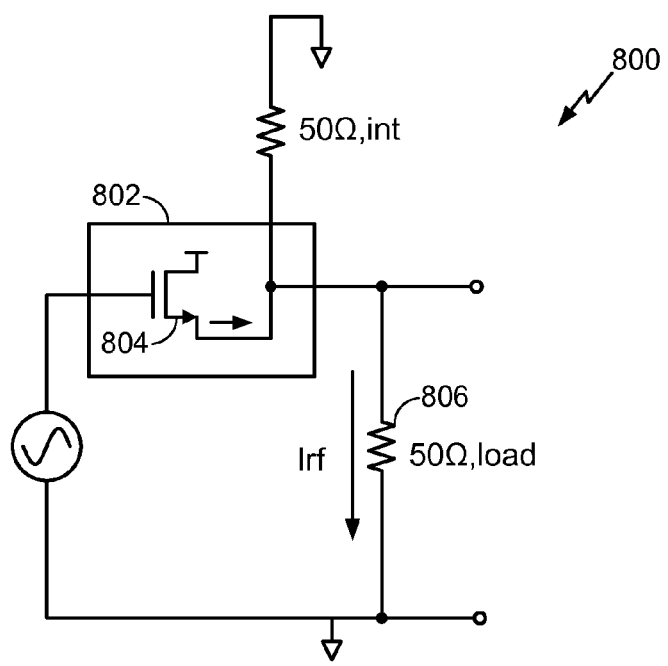
FIG. 8 shows an exemplary embodiment of a highly efficient driver amplifier for use in a wireless device.

FIG. 8 shows an exemplary embodiment of a highly efficient driver amplifier 800 for use in a wireless device. For example, the DA 800 is suitable for use as the DA 220 shown in FIG. 4. The DA 800 comprises an "isolator" 802 that is implemented using a transistor 804 in common-drain configuration. In essence, the common-drain transistor 804 delivers current in one direction to the load 806 while generating a 50Ω internal impedance match. In exemplary embodiments, this implementation can be extended to use both an NMOS and PMOS common-drain transistor at the output stage.

Figure 9:
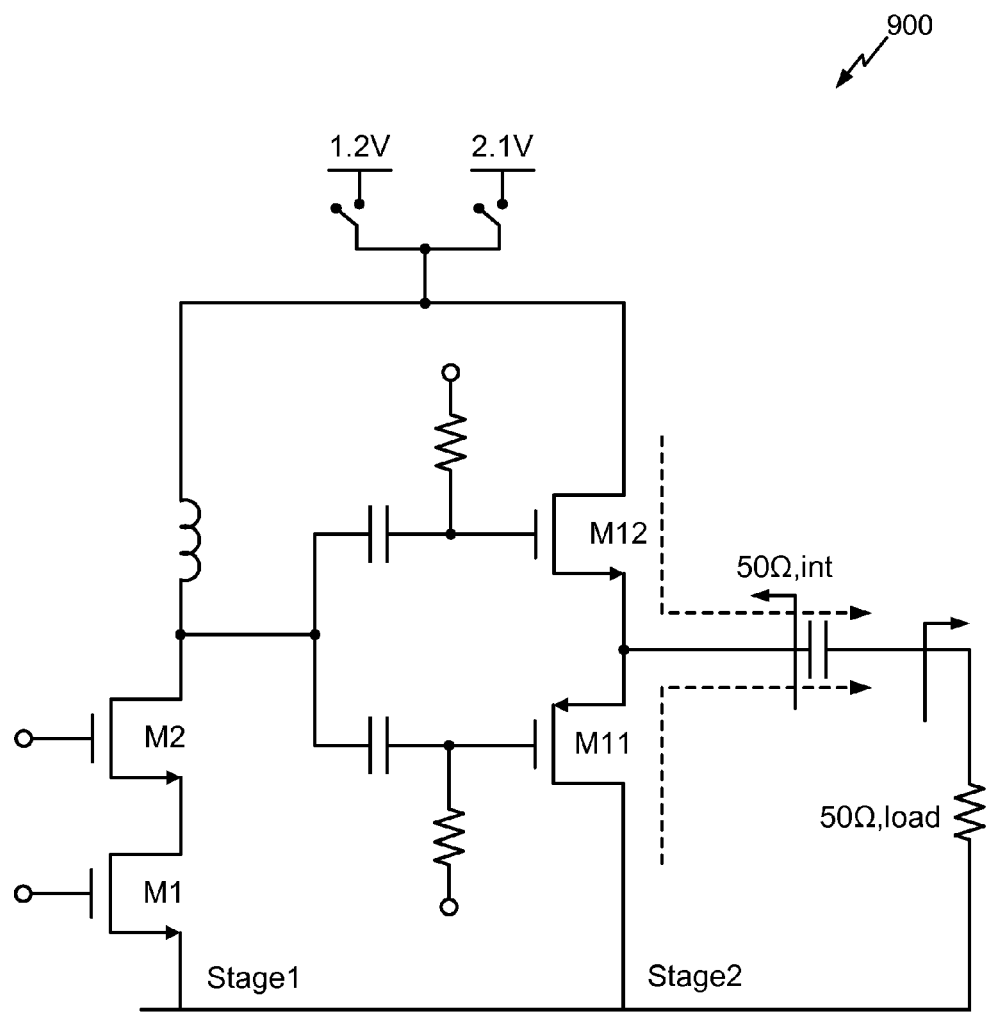
FIG. 9 shows an exemplary embodiment of a highly efficient driver amplifier for use in a wireless device.

FIG. 9 shows an exemplary embodiment of a highly efficient driver amplifier 900 for use in a wireless device. The DA 900 comprises two common-drain complementary output stages M11 and M12. The internal impedance match is determined from $[1/(gm11+gm12)]$, where gm is the transconductance. The output stages M11 and M12 are capacitively coupled at the input and at the output nodes.

The output stages are driven by an inductively loaded common-source pre-DA with a cascode-device (optional). All RF current generated by M12 and M11 is routed to the output 50Ω load. There is no current division as in classical DA implementations.

Ideally, a matched common-drain output stage has a voltage loss of 0.5. This voltage loss is compensated by a low current transconductance pre-DA (Stage1) driving a high impedance inductive load. In order to match to 50Ω (20 mS), each of the common-drain transistors should provide a 10 mS transconductance. Biasing each at an overdrive voltage of 100 mV, the required bias current for the output stage is approximately [10 mS*100 mV]=1 mA.

In practice, the output stage consumes 1.3 mA of supply current at 1.3V. The −8 dBm output power requires a signal voltage of 132 mV. Accounting for parasitic RF losses, the gain of the output stage is ~0.4. This means that the pre-DA should be supplying a voltage of [132 mV/0.4]=330 mV. In an exemplary implementation, RF load impedance for the pre-DA amplifier can be 220Ω. This means that the RF signal current to be generated by stage1 is approximately [330 mV/220 Ohm]=1.5 mA. Accounting for parasitic losses, the current consumption of the pre-DA is approximately 1.9 mA from a 1.3V supply. This means that the overall current consumption is [1.9 mA+1.3 mA]=3.2 mA from 1.3V supply. Thus, the DA 900 reduces the current consumption by more than 46%.

Therefore, a low power driver amplifier (DA) stage is provided. In exemplary embodiments, the DA 900 comprises two building blocks, namely: an inductively loaded common-source amplifier (with an optional cascode) to implement voltage gain, and an active RF isolator output stage to control the directionality of the RF current circulation. The composite structure reduces the current consumption of the DA 900 by more than 46% at typical talk-time output power levels (i.e., −8 dBm).

Figure 10:
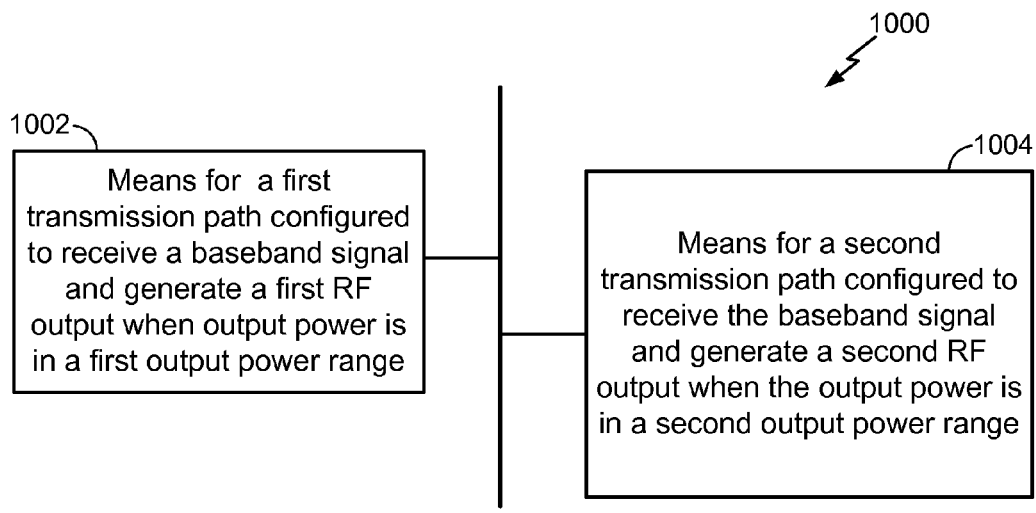
FIG. 10 shows an exemplary embodiment of a transmitter apparatus.

FIG. 10 shows an exemplary embodiment of a transmitter apparatus 1000. For example, the apparatus 1000 is suitable for use as the transmitter 400 shown in FIG. 4. In an aspect, the apparatus 1000 is implemented by one or more modules configured to provide the functions as described herein. For example, in an aspect, each module comprises hardware and/or hardware executing software.

The apparatus 1000 comprises a first module comprising means (1002) for a first transmission path configured to receive a baseband signal and generate a first RF output when output power is in a first power range, which in an aspect comprises the transmission path 402.

The apparatus 1000 also comprises a second module comprising means (1004) for a second transmission path configured to receive the baseband signal and generate a second RF output when the output power is in a second power range, which in an aspect comprises the transmission path 404.

Figure 11:
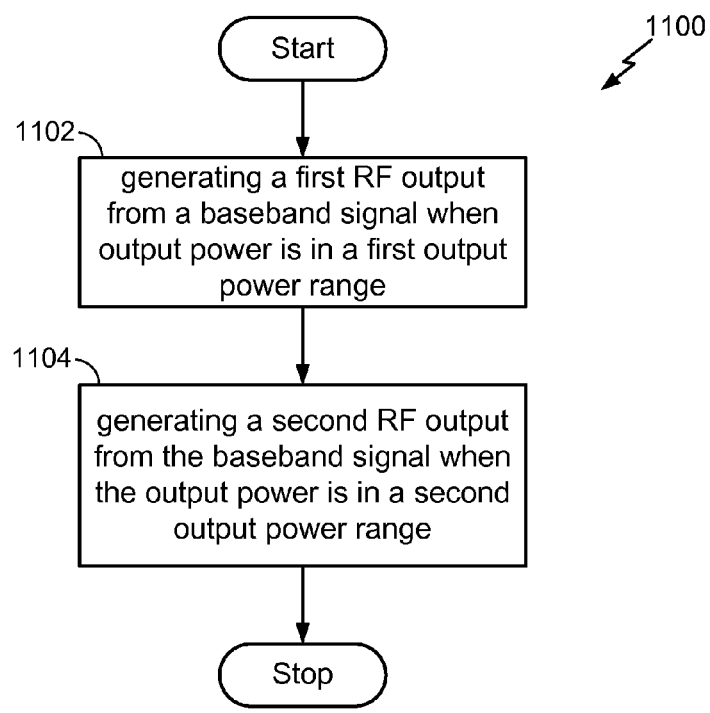
FIG. 11 shows an exemplary embodiment of a method for transmitting.

FIG. 11 shows an exemplary embodiment of a method 1100 for transmitting. For example, the method 1100 is performed by the transmitter 400 shown in FIG. 4.

At block 1102, a first RF output is generated from a baseband signal when output power is in a first power range, which in an aspect comprises the transmission path 402.

At block 1104, a second RF output is generated from the baseband signal when the output power is in a second power range, which in an aspect comprises the transmission path 404. In an exemplary embodiment, the generation of the second RF output is more efficient than the generation of the first RF output when the output power is at or below a selected threshold level, and the first power range is above the selected threshold level and the second power range is at or below the selected threshold level.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. A transmitter comprising:
   a first transmission path having a first upconverter configured to receive a baseband signal and generate a first RF output when output power is in a first power range; and a second transmission path having a second upconverter configured to receive the baseband signal and generate a second RF output when the output power is in a second power range and wherein the second upconverter is configured to operate more efficiently than the first upconverter when the output power is below a selected threshold level.

2. The transmitter of claim 1, the second transmission path configured to operate more efficiently than the first transmission path when the output power is at or below the selected threshold level, and wherein the first power range is above the selected threshold level and the second power range is at or below the selected threshold level.

3. The transmitter of claim 2, further comprising a controller configured to selectively enable one of the first transmission path and the second transmission path to obtain higher efficiency for a selected output power level.

4. The transmitter of claim 1, the first transmission path comprises a first driver amplifier and the second transmission path comprises a second driver amplifier, the second upconverter and the second driver amplifier operate more efficiently than the first upconverter and the first driver amplifier, respectively.

5. The transmitter of claim 4, the second driver amplifier comprises an isolator configured to direct generated current to an output load.

6. The transmitter of claim 5, the second driver amplifier comprises two common-drain complementary output stages to provide an internal impedance match determined by a reciprocal of a sum of the output stages transconductance.

7. The transmitter of claim 6, further comprising an inductively loaded common-source pre-driver amplifier configured to drive the output stages.

8. The transmitter of claim 4, the first transmission path comprises a first frequency divider coupled to the first upconverter and the second transmission path comprises a second frequency divider coupled to the second upconverter, the second frequency divider operates more efficiently than the first frequency divider.

9. The transmitter of claim 8, the first transmission path comprises a first baseband filter and the second transmission path comprises a second baseband filter, the second baseband filter operates more efficiently than the first baseband filter.

10. The transmitter of claim 1, further comprising a switch configured to selectively connect one of the first and second RF outputs to a transmitter output.

11. The transmitter of claim 1, further comprising a switch configured to selectively connect the baseband signal to the first transmission path.

12. The transmitter of claim 1, further comprising a switch configured to selectively connect the baseband signal to the second transmission path.

13. A transmitter comprising:
   means for a first transmission path having means for a first upconverter configured to receive a baseband signal and generate a first RF output when output power is in a first power range; and
   means for a second transmission path having means for a second upconverter configured to receive the baseband signal and generate a second RF output when output power is in a second power range and wherein the means for the second upconverter is configured to operate more efficiently than the means for the first upconverter when the output power is below a selected threshold level.

14. The transmitter of claim 13, the means for the second transmission path configured to operate more efficiently than the means for the first transmission path when the output power is at or below the selected threshold level, and wherein the first power range is above the selected threshold level and the second power range is at or below the selected threshold level.

15. The transmitter of claim 14, further comprising means for selectively enabling one of the first transmission path and the second transmission path to obtain higher efficiency for a selected output power level.

16. The transmitter of claim 13, the means for the first transmission path comprises a means for a first driver amplifier and the means for the second transmission path comprises a means for a second driver amplifier, the means for the second upconverter and the means for the second driver amplifier operate more efficiently than the means for the first upconverter and the means for the first driver amplifier, respectively.

17. The transmitter of claim 16, the means for the first transmission path comprises means for a first frequency divider and the means for the second transmission path comprises means for a second frequency divider, the means for the second frequency divider operates more efficiently than the means for the first frequency divider.

18. The transmitter of claim 17, the means for the first transmission path comprises means for a first baseband filter and the means for the second transmission path comprises means for a second baseband filter, the means for the second baseband filter operates more efficiently than the means for the first baseband filter.

19. A method, comprising:
   generating a first RF output from a baseband signal using a first upconverter when output power is in a first output power range; and
   generating a second RF output from the baseband signal using a second upconverter when the output power is in a second output power range and wherein the second upconverter is configured to operate more efficiently than the first upconverter when the output power is below a selected threshold level.

20. The method of claim 19, further comprising generating the second RF output more efficiently then the first RF output when the output power is at or below the selected threshold level, and wherein the first power range is above the selected threshold level and the second power range is at or below the selected threshold level.

* * * * *